United States Patent [19]

Milard

[11] Patent Number: 4,622,528
[45] Date of Patent: Nov. 11, 1986

[54] MINIATURE MICROWAVE FILTER COMPRISING RESONATORS CONSTITUTED BY CAPACITOR-COUPLED REJECTOR CIRCUITS HAVING TUNABLE WINDOWS

[75] Inventor: Roland Milard, Levis St. Nom, France

[73] Assignee: Alcatel Thomson Espace, Courbevoie, France

[21] Appl. No.: 649,592

[22] Filed: Sep. 11, 1984

[30] Foreign Application Priority Data

Sep. 27, 1983 [FR] France .............................. 83 15335

[51] Int. Cl.⁴ ........................................... H01P 1/203
[52] U.S. Cl. .................................... 333/205; 333/246;
334/82; 361/278
[58] Field of Search ............................... 333/202–207,
333/219–223, 246, 235, 168, 172, 175, 176, 185;
361/277, 278, 306, 309; 357/51; 29/25.41,
25.42; 334/82

[56] References Cited

U.S. PATENT DOCUMENTS

| | | | |
|---|---|---|---|
| 3,688,361 | 9/1972 | Bonini | 29/25.42 |
| 3,755,762 | 8/1973 | Boulin | 333/168 |
| 4,007,296 | 2/1977 | Ansell | 29/25.42 X |
| 4,074,340 | 2/1978 | Leigh | 361/321 |
| 4,157,517 | 6/1979 | Kneisel et al. | 333/205 |
| 4,268,809 | 5/1981 | Makimoto et al. | 333/202 |
| 4,288,530 | 9/1981 | Bedord et al. | 333/205 X |
| 4,342,972 | 8/1982 | Nishikawa et al. | 333/206 |

FOREIGN PATENT DOCUMENTS 1496638  10/1966  France .
1180928   2/1970  United Kingdom .

*Primary Examiner*—Eugene R. LaRoche
*Assistant Examiner*—Benny Lee

[57] ABSTRACT

The microwave filter comprises resonators constituted by capacitor-coupled rejector circuits. The tuning and coupling capacitors are composed of parallel metal plates supported and separated by the dielectric of a substrate. The surface of at least one plate of each tuning and/or coupling capacitor is provided with windows which can be sealed-off by a metal deposit in order to permit adjustment of each capacitor to its optimum value.

10 Claims, 5 Drawing Figures

MINIATURE MICROWAVE FILTER COMPRISING RESONATORS CONSTITUTED BY CAPACITOR-COUPLED REJECTOR CIRCUITS HAVING TUNABLE WINDOWS

BACKGROUND OF THE INVENTION

Bandpass or bandstop microwave filters constituted by capacitor-coupled rejector-circuit resonators are well-known. However, fabrication of such filters for use in the microwave frequency field is attended by difficulties since, at these frequencies, tuning capacitors for the resonant circuits and resonator-coupling capacitors have very low values of capacitance which cannot readily be measured or adjusted.

For example, the construction of filters operating at frequencies of a few hundred MHz leads to capacitor values of a few tenths of a picofarad in the case of tuning capacitors and of a few picofarads in the case of coupling capacitors. It is accordingly apparent that these conditions are not favorable for mass production of these types of filter since their electrical characteristics are not readily reproducible from one filter to another.

One solution to these difficulties is often provided by resonators in which quarter-wave lines short-circuited at their ends are formed by means of microwave-circuit fabrication techniques. Another solution lies in the so-called "helix" filters which are also constituted by quarter-wave lines short-circuited at the ends and wound on a mandrel, the inter-resonator couplings of these two types of filter being obtained by mutual induction between resonators.

The disadvantage of these filters, however, is that they result in bulky structures and are consequently ill-suited to certain particular applications requiring small-size and low-weight structures as is required, for example, in all components used in the manufacture of telecommunications satellites.

SUMMARY OF THE INVENTION

The object of the invention is to overcome the disadvantages mentioned in the foregoing.

To this end, the invention is directed to a miniature microwave filter, constituted by capacitor-coupled rejector circuits, the tuning and coupling capacitors being formed by parallel metal plates supported and separated by the dielectric of a substrate. The distinctive feature of the invention lies in the fact that the surface of at least one plate of each tuning and/or coupling capacitor is provided with windows which can be sealed-off by means of a metal deposit in order to permit adjustment of each capacitor to its optimum value.

In accordance with another distinctive feature of the filter which is contemplated by the invention, the coupling between consecutive resonators is achieved by means of at least two capacitors mounted in series in order to permit accurate measurement of the value of each of the two capacitors by providing access to the common branch point of the two capacitors.

Apart from the extreme miniaturization made possible by the structure of the filter in accordance with the invention, a further advantage of the invention is that it permits accurate adjustment of the coupling and tuning capacitors in spite of their low capacitance, thus guaranteeing good reproducibility of the characteristics of mass-produced filters.

BRIEF DESCRIPTION OF THE DRAWINGS

Other features of the invention will be more apparent upon consideration of the following description and accompanying drawings, wherein.

DESCRIPTION OF THE PREFERRED EMBODIMENT

Figure 1:
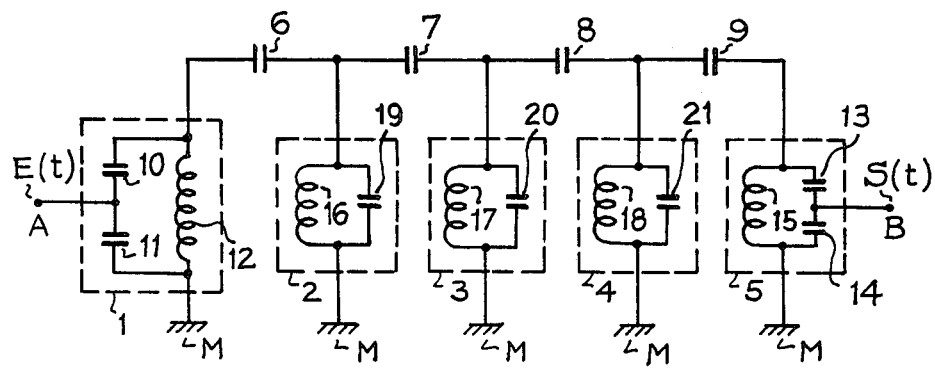
- FIG. 1 is a schematic diagram of a bandpass filter of the prior art comprising capacitor-coupled rejector circuits.

The diagram of FIG. 1 is a general arrangement diagram of a microwave filter of the prior art comprising rejector-circuit resonators of the type to which the present invention is applicable. The filter has an input A for the signal E(t) to be filtered and an output B for the filtered signal S(t), the signals S(t) and E(t) being determined with respect to each other by the relation:

$$S(t) = H \times E(t)$$

which represents the product of convolution of the signal E(t) times the function H, where H designates the transfer function of the filter. The filter further comprises an array of resonators or rejector circuits designated respectively by the reference numerals 1 to 5 within dashed-line rectangles. These rejector circuits are connected at one end to a common ground circuit M and are coupled to each other through coupling capacitors designated respectively by the reference numerals 6 to 9. In each particular case of utilization, the entire group of rejector circuits and coupling capacitors is adapted to perform the desired transfer function $$H = \frac{S(t)}{E(t)}$$

of the filter.

The rejector circuits 1 and 5 constitute the input-output resonant elements of the filter. The input A of the filter is connected to the common branch point of two series-connected capacitors 10 and 11. The non-common ends of the capacitors 10 and 11 are connected to the ends of an inductance coil 12 in order to form the input rejector circuit 1 of the filter. Similarly, the filter output B is connected to the common branch point of two series-connected capacitors 13 and 14. The non-common ends of the capacitors 13 and 14 are connected to the ends of an inductance coil 15 in order to form the output rejector circuit 5 of the filter. The intermediate rejector circuits 2, 3 and 4 are constituted respectively by inductance coils designated respectively by the references 16, 17 and 18 and coupled in parallel with capacitors designated respectively by the references 19, 20 and 21.

As mentioned earlier, the major drawback which makes it difficult to construct filters of the type shown in FIG. 1 lies in the fact that their characteristics are not readily reproducible from one filter to the next under mass production conditions.

The difficulty is twofold: in the first place it arises from the extremely low values of the coupling and tuning capacitors of the rejector circuits which result in dispersions in the values of the capacitors produced and, in the second place, the difficulty arises from the fact that it is impossible to perform accurate measurement of the values of the coupling capacitors since they cannot be isolated from the remainder of the filter circuit.

These difficulties are solved by means of the particular structure of the filter in accordance with the invention as shown in FIGS. 2 to 5.

Figure 2:
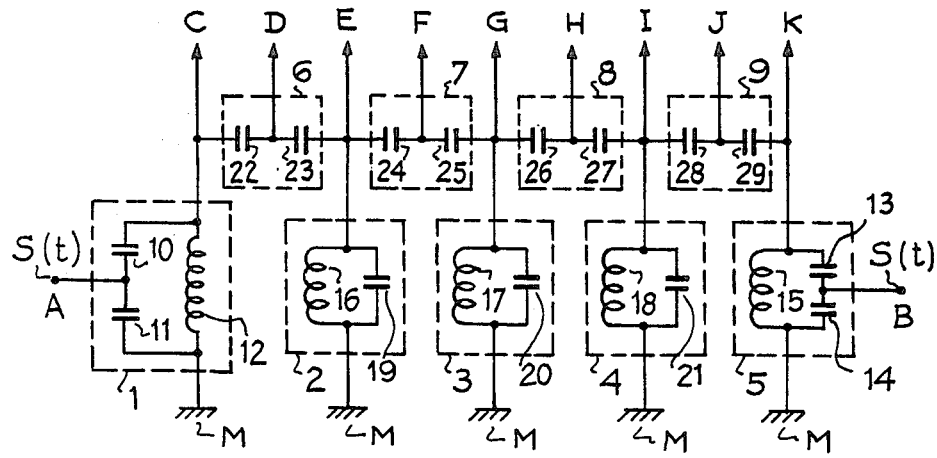
- FIG. 2 is a schematic diagram of a bandpass filter in accordance with the invention.

The general arrangement of the filter in accordance with the invention as shown in the schematic diagram of FIG. 2 is similar to the arrangement of the filter shown in the diagram of FIG. 1 except for the fact, however, that the coupling means 6 to 9 which are constituted in FIG. 1 by simple capacitors are constituted in FIG. 2 by pairs of capacitors designated respectively by the references 22, 23; 24, 25; 26, 27; 28, 29; said pairs being connected in series between the ends C, E, G, I, K respectively of the rejector circuits 1, 2, 3, 4, 5, and not to the ground M. By virtue of the similarity between FIGS. 1 and 2, the same references are assigned to elements which are identical in the two figures. In FIG. 2, the points D, F, H and J designate respectively the common branch points between two capacitors of the same pair, of the capacitor pairs designated respectively by the references 22, 23; 24, 25; 26, 27; 28, 29. This arrangement has the advantage of permitting accurate measurement of the coupling capacitors by providing for measurement purposes the possibility of connecting the ungrounded end of the rejector circuits to ground in order to isolate each measured capacitor from all the other filter elements. In fact, by short-circuiting to ground M the ends C and E of the rejector circuits 1 and 2, the capacitors 22 and 23 are isolated from all the other circuits of the filter and consequently make it possible to measure the capacitance at the branch point D which results from parallel connection of the capacitors 22 and 23. It will be noted that, in accordance with this principle, the same measurement can be repeated at the branch points F, H and J.

Figure 3:
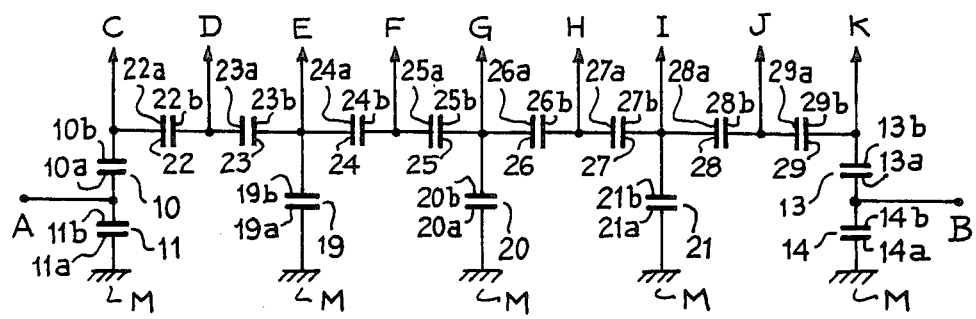
- FIG. 3 is a schematic diagram of the capacitive circuit employed for the construction of the microwave filter in accordance with the invention.
Figure 4:
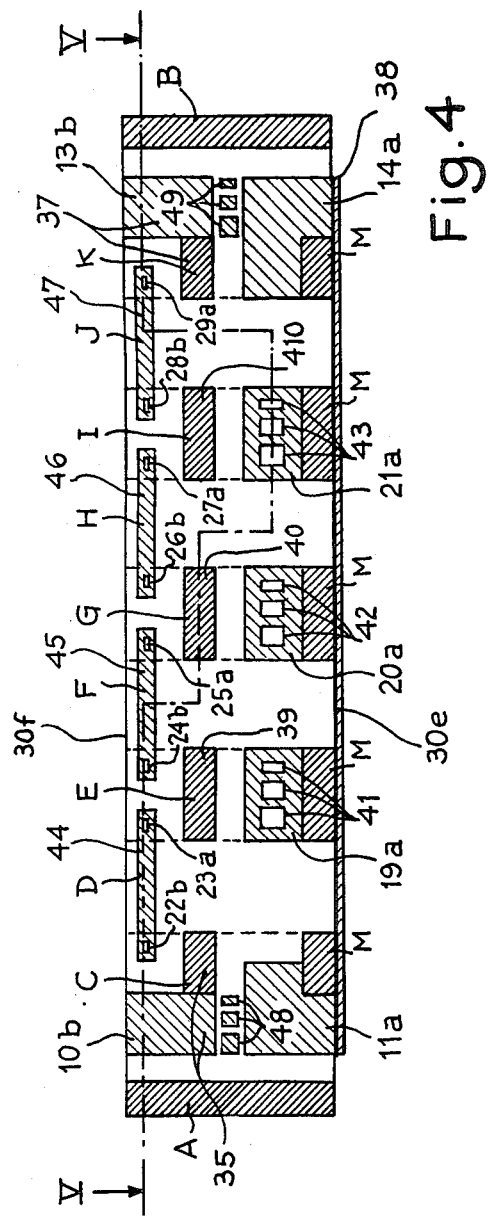
- FIG. 4 illustrates one example of construction of a microcircuit designed in accordance with the schematic diagram of FIG. 3.
Figure 5:
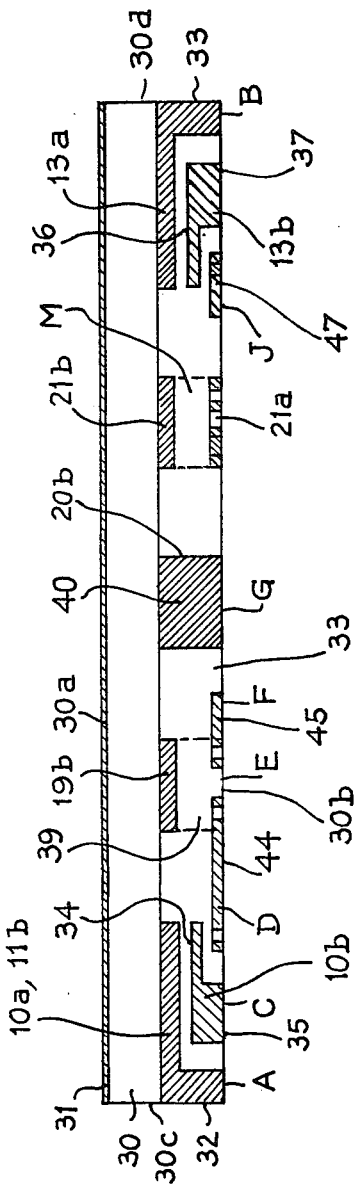
- FIG. 5 is a sectional view taken along the line V—V of the microcircuit shown in FIG. 4.

FIG. 3 illustrates the constructional arrangement adopted for the capacitive circuit of the filter shown in FIG. 2. This diagram comprises the same elements as those of FIG. 2 except for the fact, however, that the inductance coils 12, 15, 16, 17 and 18 placed between the connection ends C, E, G, I, K of the rejector circuits and ground M are not shown. In this figure, the conductors of each capacitor are designated by the same references as those assigned to the corresponding capacitors of FIG. 2 but followed by the indices a and b. The corresponding capacitive microcircuit shown in FIGS. 4 and 5 comprises a substrate 30 constituted by two flat rectangular faces $30_a$ and $30_b$, two end faces $30_c$ and $30_d$ placed across the width of the substrate and two longitudinal faces $30_e$ and $30_f$. The substrate 30 is constituted by a material having high permittivity such as magnesium titanate, alumina or Teflon and having a thickness of a few tenths of a millimeter between the two faces $30_a$ and $30_b$. The first face $30_a$ supports a ground line 31. Metal plates $10_a$, $19_b$, $20_b$, $21_b$ and $13_a$ represent the conductors of the capacitors 10, 19, 20, 21 and 13 respectively; and as shown in FIG. 5 are buried, isolated from each other by gaps in the thickness of the substrate 30 and aligned in this order on one plane which is parallel to the face $30_a$ of the substrate. The plate $10_a$ is located at the far left near the end face $30_c$ and the plate $13_a$ is located at the far right near the end face $30_d$. The metal plates $10_a$, $19_b$, $20_b$, $21_b$, $13_a$ have an approximately rectangular shape, the dimension of one side of each plate being approximately equal to the width of the substrate. The plate $10_a$ has a flanged edge 32 which forms a projection on the plate and is placed against the end face 30. The height of the projecting edge is sufficient to ensure that the end face of said flanged edge 32 emerges from the face $30_b$ of the substrate, thus forming the connection point A of the filter input. In a more or less identical manner, the plate $13_a$ has a flanged edge 33 which projects from the plate and is so arranged as to be placed against the end face $30_d$ of the substrate, the height of the projecting edge being sufficient to ensure that the end face of the flanged edge 33 emerges from the face $30_b$ of the substrate, thus forming the connection point B of the filter output. The metal plate $10_b$ which forms the second conductor of the capacitor 10 has a buried portion 34 and an L-shaped projecting portion 35 on one of its faces which emerges from the face $30_b$ of the substrate. One arm of the L which is parallel to the longitudinal direction of the substrate forms the connection point C of FIG. 3. The metal plate $10_b$ has approximately rectangular dimensions and is placed opposite and in parallel relation to the plate $10_a$ between this latter and the top face $30_b$ of the substrate. One side of the plate $10_b$ is placed against the longitudinal face $30_f$ and its length is approximately equal to that of the corresponding side of the plate $10_a$ which is parallel thereto. The length of the side adjacent to the aforementioned side of the plate $10_b$ is approximately equal to one-half the width of the substrate.

In a practically similar manner, the plate $13_b$ which is shown in hatched lines within the thickness of the substrate and forms the second conductor of the capacitor 13 of FIG. 3 has a buried portion 36 and an L-shaped projecting portion 37 which terminates on the face $30_b$ of the substrate. One arm of the L is parallel to the longitudinal direction of the substrate and forms the connection point K shown in FIG. 3. The metal plate $13_b$ has approximately rectangular dimensions and is placed opposite and in parallel relation to the plate $13_a$ between this latter and the top face $30_b$ of the substrate. One side of the plate $13_b$ is placed against the longitudinal face $30_f$ and its length is approximately equal to that of the corresponding side of the plate $13_a$ which is parallel thereto.

The metal plates $19_b$, $20_b$, $21_b$ are placed between the plates $10_a$ and $13_a$ and also have projecting portions which are located in this case approximately at a center line of the plates $10_a$ and $13_a$, and are designated respectively by the references 39, 40 and 410. Said projecting portions emerge from the surface $30_b$ of the substrate in order to form branch points E, G, I as shown in FIG. 3.

Spaced metal plates designated by the references $11_a$, $19_a$, $20_a$, $21_a$ and $14_a$ and corresponding to the conductors (connected to ground M) of the capacitors 11, 19, 20, 21 and 14 shown in FIG. 3 are placed above the face $30_b$ of the substrate opposite to and in parallel relation respectively to the plates $10_a$, $19_b$, $20_b$, $21_b$ and $13_a$. The plates aforesaid have approximately rectangular shapes and are connected to the ground line 31 by means of one of their sides through a metallized strip 38 which covers the longitudinal face $30_e$ of the substrate. Said spaced metal plates are also arranged so as to be located opposite to the projecting portions 35, 39, 40, 410 and 37 between these projecting portions and the metallized strip 38, see FIG. 4. The opposite side which is in contact with the metallized strip 38 is remote from the corresponding projecting portion in order to ensure insulation between each plate and the corresponding projecting portion. The metallic strip 31 on the substrates surface $30_a$ (FIG. 5) serves as a ground for grounding of capacitors. Also, the strip 38 (FIG. 4) which runs along one of the narrow sides of the substrate is in electrical contact with the metallic strip 31 so as to become part of an electrical ground. The metal elements M (bottom of FIG. 4) are in electrical contact with the strip 38 so as to be a portion of the ground structure. Capacitor plates connect with this ground structure as noted above, for example, for connection of the capacitors 19-21 of FIGS. 2-3 to ground.

The other terminal of the capacitors 19-23 (FIGS. 2 and 3) share a common node with a terminal of the rejection circuits 2-4 and connect with terminals E, G, and I. The terminals E, G, and I appear in FIGS. 2, 3 and 4 so that a comparison of the schematic and physical structures can be made. These terminals connect with metallic elements 39, 40 and 410 respectively, which metallic elements are brought out through the bottom surface $30_b$ of the substrate 30 so as to provide access for grounding these terminals during testing or alignment of the filter.

The plates $19_a$, $20_a$, $21_a$ are provided with windows 41, 42, 43 which have variable areas and can be sealed-off by means of a metallization in order to permit adjustment of the values of the corresponding capacitors 19, 20 and 21 of FIG. 3 by modifying the surface area of the plates $19_a$, $20_a$ and $21_a$ at will.

In a preferred embodiment of the invention, the areas of the windows on one plate will all be different and will be graded for example in much the same manner as the weights of a weight box in order to facilitate accurate adjustment of the capacitors. Such a selection of areas corresponds to the selection of weights in a set of weights used in a balance scale wherein an unknown mass is placed in one pan and a set of weights is placed in the other pan to balance the scale. The weights, and similarly with the areas of the windows, are given different specific sizes which reduce the total number of weights necessary to secure a balance of the scale. Similarly, the use of different sizes of window areas minimizes the number of windows required to provide a full range of choice of area to a capacitor plate.

Metallic strips 44 to 47 are placed on the face $30_b$ of the substrate in the longitudinal direction of this substrate above the gaps formed between the buried plates $10_b$, $19_b$, $20_b$, $21_b$ and $13_b$. The length of each strip is sufficient to ensure that these ends are each in overlapping relation to the two buried plates defining the gap above which said strip is located in order to form the coupling capacitors designated respectively by the references 22 to 29 in FIG. 3.

The ends of the metallic strips 44 to 47 are also pierced with at least one window as designated respectively by the references $22_b$, $23_a$, $24_b$, $25_a$, $26_b$, $27_a$, $28_b$ and $29_a$, each window being subsequently intended to be sealed-off whenever necessary in order to adjust the capacitances of the coupling capacitors 22 to 29.

In addition, metallic pads 48 and 49 are placed above the surface $30_b$ of the substrate at approximately one-half the width of the substrate between the ends respectively of the plates $10_b$ and $11_a$ and of the plates $13_b$ and $14_a$ in order that each pad may if necessary be connected by means of a metal deposit to either of the two ends of the plates located opposite in order to produce an artificial increase in the surface area of either of the two plates, thus making it possible to adjust at will the value of the input and output capacitors 10, 11, 13 and 14.

With respect to inductance, the plate $19_b$ and the corresponding plates in the other rejector circuits, extend in the direction of current flow between the elements 39 and M, and the corresponding elements in the other rejector circuits. As is well known, the length and cross-sectional dimensions of a circuit element determine how much inductance will be presented to current flowing through the element. At the high frequencies of interest in the design of the filter, inductive and capacitive elements have physical structures (as is well known) which are of similar physical size. Thus, the plate $19_b$ and the corresponding plates in the other ones of the rejector circuits serve in the dual capacity of providing inductance as well as being a part of a capacitor.

The structure of the microwave filter in accordance with the invention and as described in the foregoing advantageously permits adjustment and setting of the tuning capacitors of the resonant circuits and of the coupling capacitors which provide a connection for each resonator. Accessibility of the branch points C, D, E, F, G, H, I, J, K of the capacitive circuit obtained by means of the projecting portions of the buried plates and by means of the connecting strips 44 to 47 in fact make it possible to short-circuit each tuning capacitor at will in order to permit accurate measurement of the coupling capacitor placed on each side of the metallic connecting strips 44 to 47. The ease of measurement thus achieved is completed by the ease of adjustment provided for each tuning and coupling capacitor by sealing-off the windows 41, 42 and 43. This adjustment can be obtained directly by measuring the capacitance of a coupling capacitor which makes it possible by means of the mathematical model of the filter to determine by calculation the values which have to be given to the other capacitors. When these values are known, it then becomes possible by virtue of the convenient possibilities of adjustment just described to adjust the filter capacitors to their optimum values.

The example which has just been given in the case of a preferred embodiment of the invention is not limited to the filter described in the foregoing. It will be readily apparent that the invention is also applicable to alternative forms of construction which can be drawn in particular from techniques of fabrication of thin or thick film microcircuits by screen process or by photoetching.

It will further be apparent that the invention is limited neither to the number of resonators employed nor to the structure of these latter which can have structures in series rather than the structures in parallel which have been considered in the embodiment according to the invention, nor to the mode of coupling of the input and output resonators to the circuits which are external to the filter.

What is claimed is:

1. A miniature microwave filter comprising capacitor-coupled rejector circuits having a plurality of inductance coils associated with a plurality of capacitors which include tuning capacitors and coupling capacitors, wherein each one of the tuning and coupling capacitors of the rejector circuits is composed of corresponding parallel metal plates supported by a substrate of dielectric material and separated by the dielectric material of the substrate, the surface of at least one plate of each one of the plurality of said capacitors being provided with windows, any one of said windows can be sealed off by means of a metal deposit; and wherein any one of said windows, upon being sealed-off by the metal deposit alters the value of capacitance of a corresponding capacitor to tune the filter.

2. A filter according to claim 1, wherein said tuning capacitors and said coupling capacitors are arranged sequentially along the filter defining sections thereof, at least two of said sections being connected in series in order to permit accurate measurement of the value of each of the two capacitors, there being access to the common junction point of said two capacitors, said measurement being obtained upon a grounding of terminals of said capacitors which are away from said common junction point.

3. A filter according to claim 2, wherein the areas of the windows in the surface of the at least one plate are all different.

4. A filter according to claim 2, wherein the area of any one window of said windows in one plate differs from the area of every other window in said plate in order to facilitate a selection of capacitance of the capacitors.

5. A filter according to claim 4, wherein said tuning capacitors and said coupling capacitors are arranged sequentially along the filter in an arrangement defining sections of the filter, each of said sections having one of said rejector circuits, each of said rejector circuits comprising one of said tuning capacitors, one of said rejector circuits being an input rejector circuit coupled to an input terminal of the filter and another of said rejector circuits being an output rejector circuit coupled to an output terminal of the filter, said filter further comprising metallic pads placed in proximity to the plates of the tuning capacitors of the input and output rejector circuits of the filter in order that the area of a plate located in proximity to the pads may be increased at will by the respective values of the corresponding surface elements of said pads.

6. A filter according to claim 5, wherein for each of said pads, the spacing between a pad and its corresponding plate is sufficiently small to permit a joining of a pad and a plate by a metal deposit, thereby to increase the area of the plate by the surface of the pad.

7. A filter according to claim 6, wherein each of the capacitors having a plate with windows also has a second plate facing the window plate, the plates provided with windows are located external to the substrate and wherein the second plates are buried within the substrate.

8. A filter according to claim 7, wherein said substrate has a first face and a second face disposed on opposite sides of said substrate and extending in a longitudinal direction between an input terminal and an output terminal of said filter, there being third and fourth longitudinal faces disposed on opposite sides of said substrate and joining said first and said second faces; and wherein the plates provided with windows are disposed along said first face of the substrate, there being a first metallized strip which covers said second face of the substrate, said window plates being joined to said first strip by means of a second metallized strip which covers said third face of said substrate.

9. A filter according to claim 8, further comprising structural means serving as inductance coils of rejector circuits wherein one section of said structural means is joined to one of said window plates whilst the other end of said section of said structural means is joined to the oppositely facing buried plate.

10. A filter according to claim 9, wherein the capacitor plates are deposited on the substrate by screen process.

* * * * *